United States Patent
Gracias et al.

(10) Patent No.: US 6,620,741 B1
(45) Date of Patent: Sep. 16, 2003

(54) METHOD FOR CONTROLLING ETCH BIAS OF CARBON DOPED OXIDE FILMS

(75) Inventors: David H. Gracias, Portland, OR (US); Hyun-Mog Park, Beaverton, OR (US); Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/166,150

(22) Filed: Jun. 10, 2002

(51) Int. Cl.7 .................. H01L 21/31; H01L 21/469
(52) U.S. Cl. .......... 438/780; 438/780; 438/689; 438/711; 438/733; 438/790; 438/793; 438/794; 349/1; 349/2; 427/447; 427/255.14; 257/40
(58) Field of Search .......... 438/780–81, 788–790, 438/793–794, 733, 689, 711; 349/1–2; 257/40; 427/447, 255.14

(56) References Cited

U.S. PATENT DOCUMENTS

| 6,350,670 | B1 | * | 2/2002 | Andideh et al. | 438/618 |
| 2002/0096778 | A1 | * | 7/2002 | Cox | 257/774 |
| 2002/0115285 | A1 | * | 8/2002 | Wong | 438/638 |
| 2002/0164885 | A1 | * | 11/2002 | Lill et al. | 438/739 |
| 2003/0003710 | A1 | * | 1/2003 | Modek | 438/625 |
| 2003/0008528 | A1 | * | 1/2003 | Xia et al. | 438/787 |
| 2003/0022511 | A1 | * | 1/2003 | Han et al. | 438/710 |
| 2003/0032300 | A1 | * | 2/2003 | Waldfried et al. | 438/725 |
| 2003/0060052 | A1 | * | 3/2003 | Kim et al. | 438/694 |
| 2003/0064607 | A1 | * | 4/2003 | Leu et al. | 438/780 |
| 2003/0077857 | A1 | * | 4/2003 | Xia et al. | 438/200 |
| 2003/0082924 | A1 | * | 5/2003 | Andideh et al. | 438/778 |

\* cited by examiner

*Primary Examiner*—Matthew Smith
*Assistant Examiner*—G. Lee
(74) *Attorney, Agent, or Firm*—Blakely, Sokoloff, Taylor & Zafman LLP

(57) ABSTRACT

A method for controlling etch bias of carbon doped oxide films comprising performing the etch in a cyclic two step process i.e., a carbon doped oxide (CDO) removal process, said CDO removal process comprises a first gas to etch a trench in the CDO layer. The CDO removal process is followed by a polymer deposition process. The polymer deposition process comprises introducing a second gas in the reactor to deposit a polymer in the trench of the CDO layer. The first gas comprises a first molecule having a first ratio of carbon atoms to fluorine atoms, and the second gas comprises a second molecule having a second ratio of carbon atoms to fluorine atoms, such that the second ratio of carbon atoms to fluorine atoms is greater than the first ratio of carbon atoms to fluorine atoms. The above process may be repeated to etch the final structure.

30 Claims, 3 Drawing Sheets

METHOD FOR CONTROLLING ETCH BIAS OF CARBON DOPED OXIDE FILMS

BACKGROUND

One of the trends in the manufacture of semiconductor devices is to shrink the size of the semiconductor devices. Therefore, the size of components (e.g., trenches vias, contacts, interconnect lines, plugs etc.) that form the semiconductor devices have correspondingly continued to shrink. This results in an increase in the density of the components that form the semiconductor devices. Today, semiconductor devices are manufactured with the components having submicron dimensions, necessitating the routine fabrication of submicron structures such as trenches and vias.

Due to the smaller size of semiconductor devices and the increased density of the components that form the semiconductor device it is essential to control the critical dimensions (CDs) of the components. The CD of a component is the dimension of a specified geometry that must be within design tolerances. The CD may represent the width of a patterned line or the distance between two lines necessary to maintain the semiconductor device's performance consistency. If the CDs of the components are not controlled, the components may not perform according to design specifications (e.g., due to a change in resistivity, capacitance or other electrical specifications) resulting in a degradation of the performance of the semiconductor device, or even in a catastrophic failure of the semiconductor device.

In order to control the CD of the components, the process used to manufacture the components should control at least the etch bias. Etch bias is the difference between the desired dimension patterned after photolithography, and the dimension of the component actually formed after etching. For example, if the desired width of a trench is 1 $\mu$m (patterned after photolithography) and if the process used to manufacture the trench etches a 1.30 $\mu$m trench, then the process is said to have an etch bias of ±0.3 $\mu$m. Having a poor etch bias is undesirable as the CD of the component may not be maintained, resulting in a possible degradation and/or failure of the semiconductor device.

FIGS. 1A–1C illustrate a prior art process used to etch a trench in a dielectric layer of a semiconductor device. One having ordinary skill in the art will appreciate that components e.g., trenches and vias may be used in dual damascene integration of copper interconnects, and the dielectric layer insulates the copper interconnect lines, vias, contacts, etc. As illustrated in FIG. 1A, a semiconductor device 100 comprises a carbon doped oxide (CDO) dielectric layer 110. The CDO dielectric layer 110 is a compound comprising $SiO_2$, C, and H, and may be deposited by any one of a variety of methods (e.g., chemical vapor deposition, by spinning the CDO on a wafer etc.). A photoresist layer 120 is deposited on top of the dielectric layer 110. The photoresist layer has a window 130 having a width equal to the CD of the width of the trench. In a positive resist technique, the photoresist layer 1 20 is exposed to light and developed in a developing solution to remove the portions of the photoresist layer that are exposed to light. Therefore, FIG. 1A illustrates the photoresist layer 1 20 after the portion of the photoresist layer that is exposed to light is removed. One having ordinary skill in the art will appreciate that negative resist techniques may also be used to etch components e.g., trenches, vias etc.

FIG. 1B illustrates the semiconductor device 100 after the CDO dielectric layer has been subjected to a plasma etch process. The plasma etch process comprises exposing the semiconductor device 100 to a plasma comprising a carbon fluorine gas (e.g., $C_4F_8$, $C_2F_6$, or $CF_4$), oxygen or nitrogen, and argon in a reactor. The plasma is struck at radio frequency (RF) power in the range of 1000–4000 Watts. The plasma etch process is anisotropic and a trench 135 is formed after the semiconductor device 100 is subjected to the plasma in the reactor for a predetermined time period. Due to the reaction of the plasma, and in particular the oxygen in the plasma with the organic carbon containing species $CH_3$ etc. in the sidewalls of the trench 135, gasses e.g., carbon dioxide and carbon monoxide are released. The depletion of organic carbon containing species from the sidewalls of the CDO dielectric layer 110 results in a depletion region 140. The depletion region 140 is silica like and is easily stripped by fluoride ion containing reagents that are used during the wet clean process.

FIG. 1C illustrates semiconductor device 100 after the wet clean process. As illustrated in FIG. 1C, the ashing or wet clean process removes the photoresist layer 120. In addition, the wet clean process removes the depletion region 140 and causes the width of the trench to be larger than the CD of the trench (CDO blow out). Having a trench width larger than the CD of the trench is undesirable. If the depletion region 140 is left in place and not removed by the wet clean process, the dielectric constant 'k' of the depletion region is increased. This increase in the dielectric constant results in the dielectric layer being less effective as an insulating material, and results in undesirable capacitive cross-talk between adjacent copper lines.

BRIEF DESCRIPTION OF THE DRAWINGS

One or more embodiments of the present invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements.

DETAILED DESCRIPTION

Described is a method for controlling etch bias of carbon doped oxide based dielectric films. In the following description, numerous specific details such as specific materials, reactor pressure, reactor power, etc. are set forth in order to provide a thorough understanding of the one or more embodiments of the present invention. It will be apparent, however, to one of ordinary skill in the art that the one or more embodiments of the present invention may be practiced without these specific details. In other instances, well-known materials or methods have not been described to avoid unnecessarily obscuring this description. Those of ordinary skill in the art, with the included description, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described.

Figure 2A:
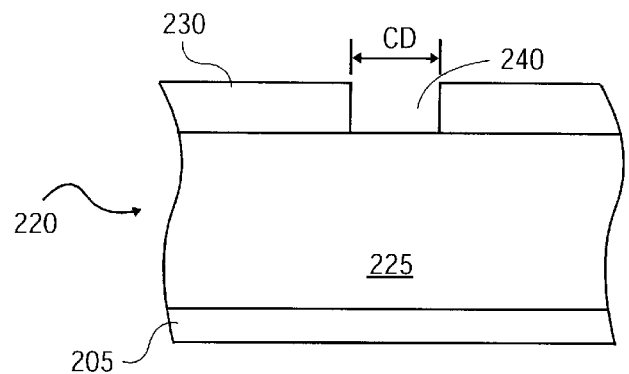
FIGS. 2A–C illustrate one cycle of a process used to etch a trench in a dielectric layer of a semiconductor device according to one embodiment of the invention.
Figure 2B:
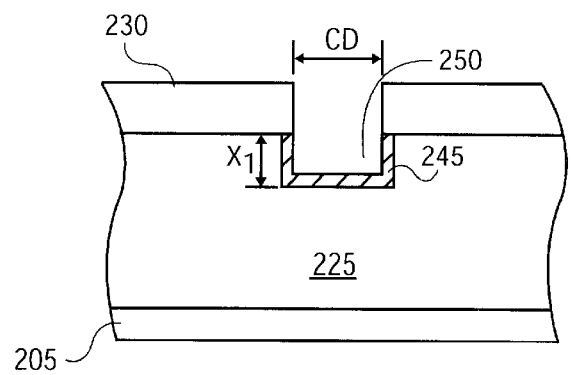
Figure 2C:
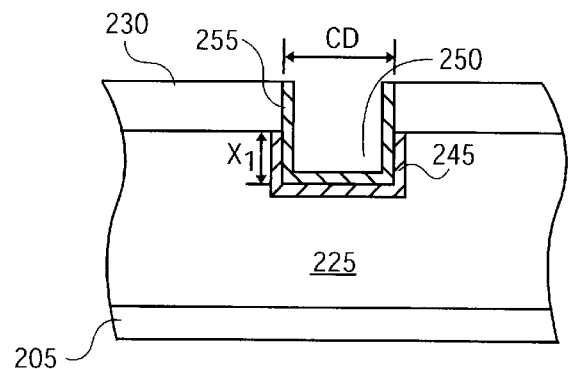

Each cycle of the method used for controlling etch bias of carbon doped oxide based dielectric films comprises two processes, a first process called the CDO removal process (illustrated in FIG. 2B), and a second process called the polymer deposition process (illustrated in FIG. 2C). During the CDO removal process, a first gas is used along with high reactor power to remove CDO from the bottom of a trench. In one embodiment of the invention, the first gas is a gas comprising a molecule of carbon and fluorine atoms having a first ratio of carbon atoms to fluorine atoms. During the polymer deposition process, a second gas is used along with lower reactor power to deposit a carbon polymer on the sidewalls of the trench. In one embodiment of the invention, the second gas has a molecule comprising a second ratio of carbon atoms to fluorine atoms, such that, the ratio of carbon atoms to fluorine atoms in the second gas molecule is greater than the ratio of carbon atoms to fluorine atoms in the first gas molecule. The carbon polymer deposited during the polymer deposition process protects the sidewalls and prevents a positive etch bias during subsequent etch processes. Thus, during each cycle the sidewall of the trench is protected while the bottom of the trench is etched resulting in minimum CDO blow out.

When forming a semiconductor device, circuits often need to be formed to electrically connect one device to another device. One method for forming an electrical connection is to form trenches or openings in the substrate overlying, underlying, adjoining, etc. the devices which are to be connected. These openings are then filled with a conductive material (e.g. copper) to form a conductive medium. In one embodiment of the invention, the trenches are formed in a multi layer structure comprising a CDO dielectric layer (that insulates the copper lines) grown above a substrate with a photo resist layer deposited above the CDO dielectric layer. One having ordinary skill in the art will appreciate that other structures and materials may be used to form a semiconductor device that comprises a CDO dielectric layer.

FIGS. 2A–2C illustrate one cycle of a process used to etch a trench in a dielectric layer of a semiconductor device according to one embodiment of the invention. Although, the embodiment of FIGS. 2A–2C describe etching a trench, one skilled in the art will appreciate that the process illustrated in FIGS. 2A–2C may be used to etch any openings e.g., vias etc. in CDO material. Although the embodiment of FIGS. 2A–2C represent one cycle of the etching process, one having ordinary skill in the art will appreciate that multiple cycles may be used to etch a trench in the CDO dielectric layer 225. For example, if a trench of depth x is desired, for a two cycle process, the first cycle may etch a trench of depth $x_1$, and a second cycle may etch a depth of $x_2$, such that $x=x_1+x_2$. In one embodiment of the invention, the number of cycles used to etch the trench depends on the thickness of the CDO dielectric layer 225.

FIG. 2A illustrates a semiconductor device 220 comprising a CDO dielectric layer 225. The CDO dielectric layer 225 comprises CDO (e.g., a compound comprising $SiO_2$, C, and H) formed on substrate 205. One skilled in the art will appreciate that CDOs may include porous films and organo silicate glasses e.g., Black Diamond manufactured by Applied Material® Technologies Inc. of Santa Ana Calif., or Nanoglass E manufactured by Honeywell® Inc. of Morris Township N.J. In one embodiment of the invention, the value of the dielectric constant 'k' of the CDO dielectric layer 225 is less than 4. Substrate 205 may be any surface, generated when making an integrated circuit. Substrate 205 may include, for example, active and passive devices that are formed on a silicon wafer such as transistors, capacitors, resistors, diffused junctions, gate electrodes, local interconnects, etc. Substrate 205 may also include insulating materials that separate such active and passive devices from a conductive layer or layers that are formed on top of them.

A photoresist layer 230 is deposited on top of the CDO dielectric layer 225. The photoresist layer 230 is patterned to define a trench that will be etched into the CDO dielectric layer 225. In one embodiment of the invention, the patterned trench in the photoresist layer 230 has a width equal to the CD of the width of the trench. In a positive resist technique, the photoresist layer 230 is patterned using conventional photolithographic techniques, such as masking the photoresist layer, exposing the masked layer to light, and then developing the unexposed portions in a developing solution to remove the portions of the photoresist layer that are exposed to light to form window 240 in the photoresist layer. FIG. 2A illustrates the photoresist layer 230 after the portion of the photoresist layer that is exposed to light is removed. One having ordinary skill in the art will appreciate that negative resist techniques may also be used to etch components e.g., trenches, vias etc.

After forming window 240, the semiconductor device 220 is placed in a reactor e.g., a plasma reactor (etcher). In one embodiment of the invention, the process of exposing to light and removing the photoresist layer that is exposed to light is performed in the plasma reactor. In one embodiment of the invention, the reactor is a Magnetic Enhanced Reactive Ion Etching (MERIE) reactor. In alternate embodiments of the invention a conventional reactive ion etcher may be used. In one embodiment of the invention, the CDO removal process is anisotropic. In one embodiment of the invention, the CDO removal process comprises a plasma etch process. During the CDO removal process the semiconductor device 220 is exposed to a plasma comprising a first gas which includes a molecule comprising carbon and fluorine atoms having a first ratio of carbon atoms to fluorine atoms. In one embodiment of the invention, the first gas has a higher percentage of fluorine atoms relative to other atoms in the gas molecule. In one embodiment of the invention, the first gas is $CF_4$.

In one embodiment of the invention, the percentage of fluorine atoms in the first gas used to form the plasma in the CDO removal process is higher than the percentage of fluorine atoms in the gas used to form the plasma in the polymer deposition process. Thus, in one embodiment of the invention, $CF_4$ is introduced in the reactor for the CDO removal process and $C_4F_8$ is introduced in the reactor for the polymer deposition process.

In one embodiment of the invention, the first gas may comprise atoms other than carbon and fluorine. In addition to the first gas other gasses such as oxygen or nitrogen, and argon may also be present in the plasma. In one embodiment of the invention, the ratio of the first gas to argon to oxygen is 10–20 parts of the first gas, to 100–200 parts of argon, to 10–20 parts of oxygen. In one embodiment of the invention, the ratio of the first gas to argon to oxygen is 1:10:1. In the reactor, the plasma is struck at RF power in the range of 1000–4000 Watts for a twelve inch wafer. In one embodiment of the invention the power at which the plasma is struck for the CDO removal process is higher that the power at which the plasma is struck for the polymer deposition process. Any commercially viable frequency, e.g., 13.56 MHz, 27 MHz, microwave frequencies etc. may be used to generate the plasma. One having ordinary skill in the art will appreciate that the plasma may be struck at other powers for other wafer sizes. In one embodiment of the invention, the pressure within the reactor is maintained between several tens to hundreds of mTorr.

Figure 1A:
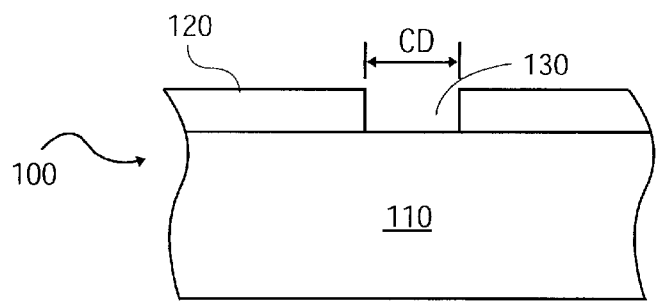
FIGS. 1A–C illustrate a prior art process used to etch a trench in a dielectric layer of a semiconductor device.
Figure 1B:
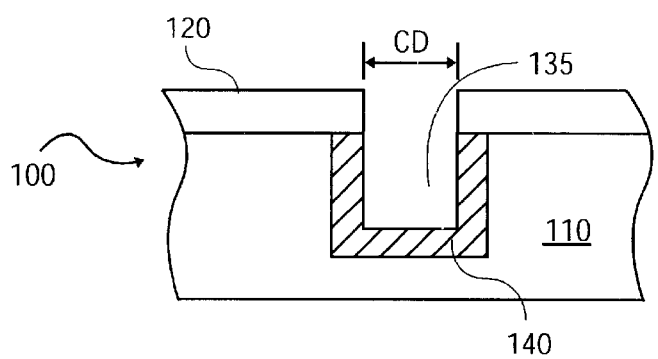
Figure 1C:
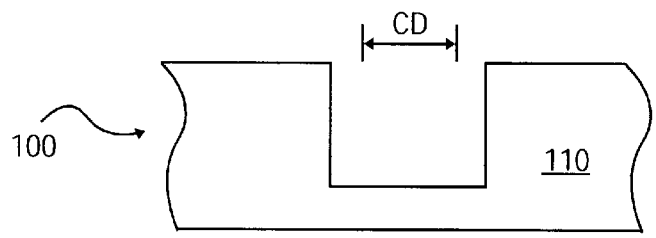

FIG. 2B illustrates the etching of trench 250. The CDO removal process is an anisotropic etch process wherein the bottom surface of the trench 250 is etched at a faster rate as compared with the etching of the side walls of the trench 250. Due to the high power at which the reactor is operated, ions in the reactor bombard the bottom surface of the trench 250 at a greater rate than the side walls. The presence of the plasma in the reactor together with the ion bombardment causes the bottom surface of the trench 250 to be etched at a greater rate than the side walls. Because the trench 250 may be etched in multiple cycles, wherein each cycle etches a fraction of the desired trench depth, the side walls of the trench 250 are subject to the CDO removal process for a fraction of the total etch time during each cycle. Therefore, the depletion of carbon from the side walls of the trench 250 is minimized. The depletion region 245 formed as a result of the CDO removal process is illustrated in FIG. 2B. Because the CDO dielectric layer 225 is exposed to the CDO removal process for a fraction of the total etch time each cycle, as compared with the depletion region 140 formed by the prior art etch process of FIGS. 1A–1C, the depletion region formed by the CDO removal process, illustrated in FIG. 2B, is substantially smaller. In particular, the depth to which carbon is depleted from the sidewalls of the trench 245 is much smaller as compared with the prior art process.

As illustrated in FIG. 2C, after the CDO removal process a second process called the polymer deposition process is performed in the reactor. In one embodiment of the invention, after the CDO removal process, the concentration of the first gas that is used in the CDO removal process is reduced in the reactor. In one embodiment of the invention, the first gas with a molecule having a first ratio of carbon to fluorine atoms is purged from the reactor. After reducing or purging the first gas from the reactor, a second gas is introduced in the reactor. In one embodiment of the invention, the second gas comprises a molecule that has a second ratio of carbon atoms to fluorine atoms, such that, the ratio of carbon atoms to fluorine atoms in the second gas molecule is greater than the ratio of carbon atoms to fluorine atoms in the first gas molecule. In one embodiment of the invention, if the concentration of the first gas in the reactor is greater than the concentration of the second gas in the reactor then CDO removal occurs. However, if the concentration of the first gas is less than the concentration of the second gas then polymer deposition occurs.

The polymer deposition process deposits a layer of polymer 255 in the trench 250 formed by the CDO removal process. The polymer deposition process comprises striking a plasma in the reactor with the second gas. In one embodiment of the invention the second gas is $C_4F_8$.

In one embodiment of the invention, the percentage of carbon atoms in the second gas used to form the plasma in the polymer deposition process is greater than the percentage of carbon atoms in the first gas used to form the plasma in the CDO removal process. Thus in one embodiment of the invention, if $C_4F_8$ is introduced in the reactor for the polymer deposition process $CF_4$ is introduced in the reactor during the CDO removal process.

In addition to the second gas, other gasses such as argon may also be used to form the plasma. In one embodiment of the invention, the ratio of the second gas to argon is 10–20 parts of the second gas to 100–200 parts of argon. In one embodiment of the invention, the ratio of the second gas to argon is 1:10. In one embodiment of the invention, during the polymer deposition process, no oxygen is used in the reactor. By not using oxygen in the reactor the depletion of carbon from the trench 250 is minimized.

In one embodiment of the invention, the plasma that is formed with the second gas is struck at RF power of about 500–1000 Watts for a 12-inch wafer. Thus, as compared with the CDO removal process the power at which the plasma is struck in the polymer deposition process is relatively low. The low power at which the reactor is operated decreases the ion bombardment (less sputtering) resulting in a more isotropic deposition. Any commercially viable frequency, e.g., 13.56 MHz, 27 MHz, microwave frequencies etc. may be used to generate the plasma. Due to the low RF power the polymer deposition process is an isotropic process and a layer of polymer 255 is deposited on the side walls as well as on the bottom surface of trench 250. The polymer that is deposited comprises fluorinated hydrocarbons, and hydrocarbons that may be cross linked to each other.

In one embodiment of the invention, in order to increase the thickness of the layer of polymer 255 the amount of carbon in the plasma may be increased. Thus, the concentration of the second gas may be increased, or a gas having a molecule with a higher ratio of carbon atoms to fluorine atoms may be used. Thus, by controlling the amount of polymer deposited on the surface of the trench, the etch bias of the trench may be controlled. In one embodiment of the invention, the pressure within the reactor is maintained between 100–400 mTorr. Thus, in one embodiment of the invention the pressure maintained in the reactor is higher during the polymer deposition process as compared with the CDO removal process. Thus, after the polymer deposition process of the first cycle the trench 250 having a polymer lining with a depth of $x_1$ is formed, where $x_1 < x$. After the first cycle, the CD of the width of the trench is substantially the same as the CD of the width of the trench illustrated in FIG. 2A.

In order to etch a trench in the CDO dielectric layer 225, each cycle comprising the CDO removal process and the polymer deposition process may be repeated multiple times until the desired trench depth is achieved. In one embodiment of the invention, if during the last cycle, the CDO removal process etches the CDO dielectric layer 225 to the desired trench depth, the polymer deposition process may not be performed. However, in one embodiment of the invention, during the last cycle the polymer deposition process may be performed to ensure cross sectional uniformity of the sidewalls of the trench following the subsequent wet clean process.

Figure 3:
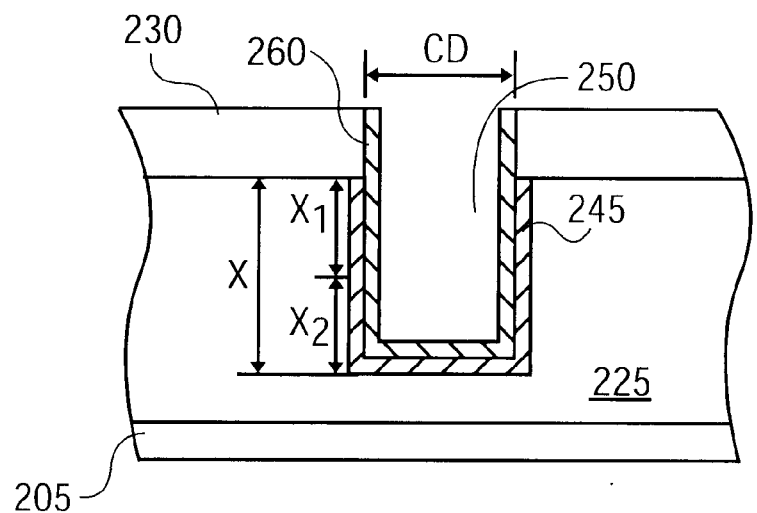
FIG. 3 illustrates a second cycle of a process used to etch a trench in a dielectric layer of a semiconductor device according to one embodiment of the invention.

FIG. 3 illustrates a second cycle of a process used to etch a trench in a dielectric layer of a semiconductor device according to one embodiment of the invention. In the process illustrated in FIG. 3, the desired trench depth is reached after the CDO removal process 225 of the second cycle. The second cycle is to etch a second portion of the trench. In particular, the second cycle increases the trench depth by $x_2$, such that the desired depth $x=x_1+x_2$, while substantially maintaining the CD of the width of the trench. During the CDO removal process of the second cycle, the polymer that was deposited on the bottom of the trench 250 during the polymer deposition process of the first cycle is removed. The polymer deposited on the side walls of the trench during the polymer deposition process of the first cycle protects the sidewalls of the trench 250 from CDO blow out during the CDO removal process of the second cycle. In one embodiment of the invention, after the desired trench depth is reached, the semiconductor device 220 is subject to a wet cleaning process described with respect to FIG. 4. In one embodiment of the invention, the trench 250 may be subject to the polymer deposition process following the CDO removal process in order to maintain a uniform trench cross section after the wet clean process.

Figure 4:
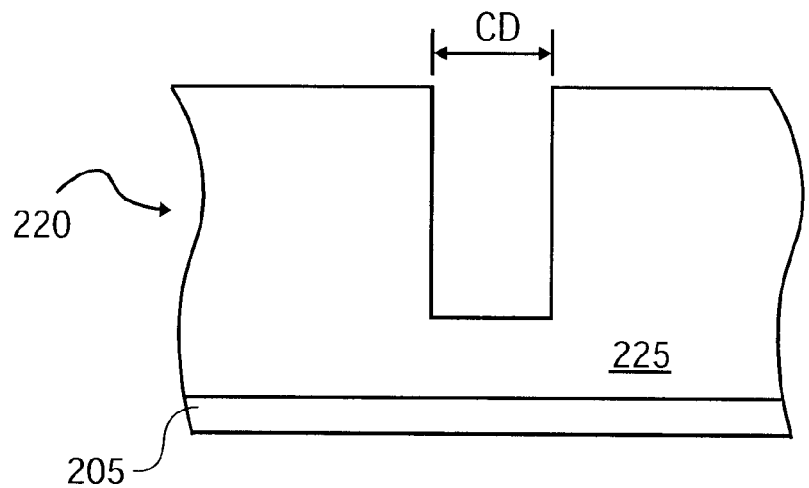
FIG. 4 illustrates a semiconductor device after the removal of the photoresist layer and the polymer from the trench according to one embodiment of the invention.

FIG. 4 illustrates a semiconductor device after the removal of the photoresist layer and the polymer from the trench according to one embodiment of the invention. As illustrated in FIG. 4, after etching the trench 250 to the desired depth, the semiconductor device 220 is subjected to conventional post etch ashing and wet cleaning using a solvent e.g., a fluoride ion containing solvent such as N methyl 2 pyrrolidone (NMP) to remove the polymer from the trench surface, and to remove the photoresist layer 230. After the wet cleaning process, the CD of the width of trench is substantially unchanged.

Thus, a method has been disclosed for controlling the etch bias of CDO films. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method comprising:
   performing a carbon doped oxide (CDO) removal process, aid CDO removal process comprising introducing a first gas to form a trench in a CDO e; and
   performing a polymer deposition process, said polymer deposition process comprising introducing a second gas to deposit a polymer in the trench of the CDO layer.

2. The method of claim 1 wherein the first gas comprises a first molecule having a first ratio of carbon atoms to fluorine atoms, and the second gas comprises a second molecule having a second ratio of carbon atoms to fluorine atoms, such that the second ratio of carbon atoms to fluorine atoms is greater than the first ratio of carbon atoms to fluorine atoms.

3. The method of claim 1 wherein the first gas has a higher percentage of fluorine atoms than the second gas.

4. The method of claim 1, wherein the first gas is $CF_4$, and the second gas is $C_4F_8$.

5. The method of claim 1, wherein the CDO removal process and the polymer deposition process are performed in a reactor.

6. The method of claim 5 wherein the reactor comprises any one of a Magnetic Enhanced Reactive Ion Etching (MERIE) reactor, and a conventional reactive ion etching reactor.

7. The method of claim 1 wherein the first gas forms a plasma at a radio frequency (RF) power of between 1000 and 4000 Watts for a 12 inch wafer.

8. The method of claim 1 wherein a plasma is struck at a power for the CDO removal process that is higher than the power at which the plasma is struck for the polymer deposition process.

9. The method of claim 8 wherein the plasma formed during the polymer deposition process does not contain oxygen.

10. The method of claim 8 wherein the plasma is struck at a radio frequency (RF) power of between 500 and 1000 Watts for a 12 inch wafer.

11. The method of claim 1 wherein the polymer comprises at least one of fluorinated hydrocarbons and hydrocarbons.

12. The method of claim 1 wherein the CDO removal process is anisotropic.

13. The method of claim 1 wherein the polymer deposition process is isotropic.

14. A method for forming a trench in a carbon doped oxide (CDO) dielectric layer comprising:
   forming a window in a photoresist layer, said photoresist layer deposited on top of a CDO layer;
   performing a carbon doped oxide (CDO) removal process, said CDO removal process comprising introducing a first gas in a reactor to form a trench in the CDO layer; and
   performing a polymer deposition process, said polymer deposition process comprising introducing a second gas in the reactor to deposit a polymer in the trench of the CDO layer, wherein the first gas comprises a first molecule having a first ratio of carbon atoms to fluorine atoms, and the second gas comprises a second molecule having a second ratio of carbon atoms to fluorine atoms, such that the second ratio of carbon atoms to fluorine atoms is greater than the first ratio of carbon atoms to fluorine atoms.

15. The method of claim 14 wherein the first gas has a greater percentage of fluorine atoms per molecule than the second gas.

16. The method of claim 14 wherein the second gas has a greater percentage of carbon atoms per molecule than the first gas.

17. The method of claim 14 wherein the first gas forms a plasma in the reactor.

18. The method of claim 17 wherein the plasma is formed in any one of a Magnetic Enhanced Reactive Ion Etching (MERIE) reactor and a conventional reactive ion etching reactor.

19. The method of claim 17 wherein the plasma is struck at a radio frequency (RF) power of between 1000 and 4000 Watts for a 12 inch wafer.

20. The method of claim 14 wherein the second gas forms a plasma in the reactor.

21. The method of claim 20 wherein the plasma does not contain oxygen.

22. The method of claim 20 wherein the plasma is struck at a radio frequency (RF) power of between 500 and 1000 Watts for a 12 inch wafer.

23. The method of claim 14 wherein the polymer comprises at least one of fluorinated hydrocarbons and hydrocarbons.

24. The method of claim 14 wherein the CDO removal process is anisotropic.

25. The method of claim 14 wherein the polymer deposition process is isotropic.

26. A method for forming trenches in a semiconductor device comprising:

providing a substrate;

depositing a carbon doped oxide (CDO) layer on the substrate;

depositing a photoresist layer above the CDO layer;

patterning said photoresist layer;

performing a carbon doped oxide (CDO) removal process, said CDO removal process comprising introducing a first gas in a reactor to form a trench in the CDO layer;

reducing the concentration of the first gas in the reactor; and performing a polymer deposition process, said polymer deposition process comprising introducing a second gas in the reactor to deposit a polymer in the trench of the CDO layer, said polymer deposition process done in the absence of oxygen.

27. The method of claim 26 wherein the first gas comprises a first molecule having a first ratio of carbon atoms to fluorine atoms, and the second gas comprises a second molecule having a second ratio of carbon atoms to fluorine atoms, such that the second ratio of carbon atoms to fluorine atoms is greater than the first ratio of carbon atoms to fluorine atoms.

28. The method of claim 26 wherein a plasma is struck at a radio frequency (RF) power of between 1000 and 4000 Watts for a 12 inch wafer during the CDO removal process.

29. The method of claim 26 wherein the second gas has a greater percentage of carbon atoms per molecule than the first gas.

30. The method of claim 26 wherein the plasma is struck at a radio frequency (RF) power of between 500 and 1000 Watts for a 12 inch wafer during the polymer deposition process.

* * * * *